United States Patent [19]
Mirle et al.

[11] Patent Number: 5,418,112
[45] Date of Patent: May 23, 1995

[54] PHOTOSENSITIVE COMPOSITIONS USEFUL IN THREE-DIMENSIONAL PART-BUILDING AND HAVING IMPROVED PHOTOSPEED

[75] Inventors: Srinivas K. Mirle, Ellicott City, Md.; Ronald J. Kumpfmiller, Marietta, Ga.

[73] Assignee: W. R. Grace & Co.-Conn., New York, N.Y.

[21] Appl. No.: 150,621

[22] Filed: Nov. 10, 1993

[51] Int. Cl.$^6$ .................. G03C 5/00; G03C 1/725; C08F 2/46
[52] U.S. Cl. .................. 430/269; 430/284; 522/8; 522/10; 522/90; 522/100; 522/103
[58] Field of Search .................. 430/269, 284; 522/8, 522/10, 90, 100, 103

[56] References Cited

U.S. PATENT DOCUMENTS

| | | | |
|---|---|---|---|
| 4,221,646 | 9/1980 | Finelli et al. | 204/159.19 |
| 4,366,228 | 12/1982 | Specht et al. | 430/281 |
| 4,575,330 | 3/1986 | Hull | 425/174.4 |
| 4,632,897 | 12/1986 | Barzynski et al. | 522/9 |
| 4,752,498 | 6/1988 | Fudim | 427/54.1 |
| 4,844,144 | 7/1989 | Murphy et al. | 164/35 |
| 4,942,001 | 7/1990 | Murphy et al. | 264/22 |
| 4,942,060 | 7/1990 | Grossa | 427/54.1 |
| 4,961,154 | 10/1990 | Pomerantz et al. | 364/522 |
| 5,167,882 | 12/1992 | Jacobine et al. | 264/22 |
| 5,198,159 | 5/1993 | Nakamura et al. | 264/22 |
| 5,208,110 | 5/1993 | Smith et al. | 428/414 |

FOREIGN PATENT DOCUMENTS

| | | |
|---|---|---|
| 2007295 | 1/1990 | Canada . |
| 2028537 | 4/1991 | Canada . |
| 2063982 | 9/1992 | Canada . |
| 378144 | 1/1990 | European Pat. Off. . |
| 450254 | 10/1991 | European Pat. Off. . |
| 506616 | 3/1992 | European Pat. Off. . |
| 517657 | 5/1992 | European Pat. Off. . |
| 9202572 | 2/1992 | WIPO . |
| 9220014 | 11/1992 | WIPO . |

*Primary Examiner*—Mark A. Chapman
*Attorney, Agent, or Firm*—Bharat C. Gandhi

[57] ABSTRACT

A method useful for stereolithography that yields enhanced photospeed, as well as a photocurable polymer composition well adapted for use with same, are disclosed.

A preferred combination includes 1,2-dimethoxy-2-phenyl acetophenone, benzophenone, and triphenyl phosphine combined with a polyurethane (meth)acrylate oligomer.

12 Claims, No Drawings

PHOTOSENSITIVE COMPOSITIONS USEFUL IN THREE-DIMENSIONAL PART-BUILDING AND HAVING IMPROVED PHOTOSPEED

FIELD OF THE INVENTION

The present invention relates to a photosensitive resin which is especially well adapted for use in rapid prototyping, or desktop manufacturing. It is particularly useful in photocurative rapid prototyping methods such as stereolithography. The resin is made from a photocurable polymer, Which is an ethylenically unsaturated oligomer based on a (meth)acrylate-containing polyurethane, polyester, or epoxy, and a photoinitiator system which is (1) an oxygen-reactive compound, (2) a photoinitiator and (3) a surface cure agent. The photocurable polymer and the photoinitiator system are typically formulated with reactive diluents. The formulated resin has an improved photospeed, which is measured by a critical exposure energy, $E_c$, of less than 1.5 milliJoules per square centimeter ($mJ/cm^2$). The instant resins are significantly faster (in some cases, about eight times faster) than the fastest currently commercially available stereolithography resin.

BACKGROUND OF THE INVENTION

Manufacturers are using stereolithography to improve product quality, to reduce expenditures and minimize the time required to bring new products to market.

One step in the introduction of a new product is the making of a model or prototype. A manufacturer needs a physical model of new or improved parts or products before it commits to production. The model allows people to physically handle the object, measure it, and detect design flaws early in the design process. Every year thousands of prototypes are made for parts that go into, for example, an automobile, airplane, or missile, the packaging of computers and other electronic systems, the components of consumer appliances, and dispensers for such products as perfumes, detergents, and shampoos—almost everything that is produced for personal use or for business. Traditional methods of making prototypes involve expensive and time-consuming manual procedures, or complex programming for numerically-controlled machine tools. Stereolithography has reduced the cost of prototypes and the time needed to make them. Many service bureaus make prototypes for companies that do not have their own stereolithographic equipment.

Stereolithography can produce short runs of certain finished products in the final material configuration directly from a computer aided design ("CAD") software. Such parts have been used as a stopgap measure to introduce products until tooling has been perfected for conventional volume production parts. A current limitation on the direct manufacture of production parts is the lack of availability of proper photopolymers. Intense research and development work is going on to develop materials that could closely resemble the final material properties. Once the appropriate photopolymers are developed, manufacturing of actual production parts could be the main use for photopolymers.

Stereolithography is a way to make solid objects by successively "printing" thin layers of a cured photopolymer, one on top of the other. A number of ways are known for accomplishing this end.

For example, U.S. Pat. No. 4,575,330 issued Mar. 11, 1986 to Hull describes a scanning method for stereolithography. A concentrated beam of ultraviolet light is focused on the surface of a container filled with a liquid photopolymer. The light beam, moving under computer control, draws a layer of the object onto the surface of the liquid. Wherever the beam strikes the surface, a very thin layer of the photopolymer reacts by polymerizing or crosslinking, and changes into a solid. To make a three-dimensional object, the entire operation is performed again and again, with the position of the object shifted slightly each time, so that the object is built up layer by layer. Very precise control of the light source is required, so a computer-controlled laser is used. The same is true of the position of the object, which is typically shifted downward in the container in small increments.

A computer-aided design, manufacture and engineering ("CAD/CAM/CAE") software mathematically slices a three-dimensional computer model of the object into many thin layers. The software controls the motion of a laser beam across the surface of the polymer and also the steplike position shifts of the formed object. The laser is focused in a tiny area and repeatedly scans across the surface of the liquid, leaving a pattern of cured and uncured areas in much the same way that light and dark points are made to produce a picture on a television screen. This type scanning is called raster scanning.

When a part has a freestanding section or overhang, a support structure is designed using the CAD program. When the part is completely built, it is removed from the container, heated to drain off excess liquid, and, if necessary, further cured in an oven. The supporting structure is cut away, and the part may be painted or surface-finished.

Another method of stereolithography involves the use of a photomask to build objects. In that method, a high power UV lamp is used to flood expose one layer of a liquid photopolymer at a time through a negative, or mask. The mask is generated electrostatically on a glass plate with a toner powder. A 2-second exposure from the lamp solidifies a thin surface layer of the photopolymer. The exposed mask is physically wiped clean and electrostatically discharged to prepare it for the next cross-section image. At the same time, the uncured photopolymer, which is still liquid, is blown (airknifed), vacuumed or washed away. The cavities left by the uncured polymer are filled with hot wax. The wax solidifies to form a support structure for the next layer. Finally, the entire surface is milled with a cutter to make it ready for the next polymer layer. The cycle is repeated, so that the object is built up layer by layer.

Stereolithography has also been used to produce wax patterns indirectly or produce resin patterns directly. A conventional method involves creating a master pattern, then producing a die and injecting the die with wax. The wax model is then coated with a porous ceramic slurry, creating a mold. The wax is melted out and metal is poured in the 'investment' mold. The mold is later broken or washed away, leaving the desired metal part. In this process, the resin pattern produced by stereolithography can replace wax and is burned rather than melted. A typical process involves heating the shelled pattern from ambient temperature to 100° C. over a 24-hour period so that there is an overall volume reduction, and subsequent burnout at 750°–900° C. This investment casting method is described in U.S. Pat. No. 4,844,144 issued to Murphy et al., Jul. 4, 1989.

Stereolithography is also available as an alternative to room-temperature-vulcanized molds, which are made out of silicone rubber and are widely used to make prototypes as well as production parts in such industries as aerospace, sporting goods, toys and decorative plastic furniture. It customarily takes about eight weeks to make a conventional pattern and the mold. With stereolithographic patterns, this time can be reduced to three to five days. The photopolymer masters produced by stereolithography are also used to make hard tooling for injection molding and blow molding. Typically, the masters are coated with arc-sprayed atomized metal and subsequently built up with reinforced epoxies or similar hard compositions. Such molds are used for prototyping or limited production runs.

In other applications, stereolithography offers new advantages that were simply unavailable before. In the medical field, CAT scan data can be used to create 3-D models of damaged body parts. By manipulation and measurement of the model, a surgeon can devise more effective treatment of an injury, reducing the need for multiple surgeries in complicated cases such as hip replacements, and decreasing recovery time.

Other methods of building objects using separately cured layers of photopolymers are also available, and new methods and equipment are expected.

One of the basic limiting requirements for any stereolithographic method is the photosensitive resin. The present invention focuses on an improved resin, which exhibits enhanced photospeed. A number of photosensitive resins are now available for use with stereolithographic equipment. Current stereolithographic applications require resins that are mechanically stable, with a resolution of 0.005 inch. The photopolymer must cure rapidly and also should be able to endure both cure and post-cure treatments with minimal distortion. At present it appears that there is some trade-off between speed of cure, or photospeed, and size stability during cure. The present invention exhibits greatly enhanced photospeed as well as size stability comparable with the fastest commercially available resins.

As photopolymer technology develops, various test criteria have begun to evolve. One such criterion is related to photospeed and is called $E_c$, the critical exposure energy, which is conveniently defined in "Rapid Phototyping & Manufacturing; Fundamentals of Stereolithography" P. F. Jacobs, Society of Manufacturing Engineers (1992), pp. 33, lines 14–16. This $E_c$ is the minimum exposure needed to induce polymerization and is measured in millijoules per square centimeter (mJ/cm$^2$). A standard technique for determining $E_c$ is the WINDOWPANE® technique, also described in "Rapid Prototyping & Manufacturing", above, at pages 24–29. For the inventors' purposes, an $E_c$ of less than 1.5 is desirable.

Various resins have been explored for use in stereolithography. For example, International Publication No. WO 92/20014 relates to polymer compositions for stereolithography that contain vinyl ether-epoxide polymers. These compositions show good accuracy, but are extremely slow. That is, they have an $E_c$ of 27. They are also sensitive to ambient humidity.

U.S. Pat. No. 5,167,882 issued to Jacobine et al. Dec. 1, 1992, relates to norbornene/thiol and free radical initiators. These materials are disclosed to lack stability (Col. 3, lines 46–51).

International Publication No. WO 92/02572 relates to an associative blend of electron-donating and electron-accepting groups, principally a mixture of polymeric and monomeric (meth)acrylates with free radical initiators and an inert thermoplastic material. These materials are disclosed to be especially useful for investment casting.

U.S. Pat. No. 4,942,001, issued to Murphy et al. Jul. 17, 1990 relates to polymeric (meth)acrylates blended with an N-vinyl monomer. The incorporation of an N-vinyl monomer such as N-vinyl pyrrolidone is undesirable, as this compound is a suspected carcinogen. It is disclosed that exposure to preferably 0.2 to about 5 Joules per square centimeter (Col. 2, lines 65–66) will partially cure the blend, resulting in gelatinous and mechanically weak object (Col. 3, lines 3–9) and is subject to further exposure to radiation or thermal cure. (Col. 4, lines 32–47).

Various publications relate to (meth)acrylate formulations and free-radical photopackages. EP 506616 corresponding to Canadian Patent No. 2,063,982 relates to polyurethane (meth)acrylate and various (meth)acrylates and contains no photosensitivity data; EP 517657 relates to polyester (meth)acrylates; EP 378144 relates to (meth)acrylated epoxies and discloses that unspecified additives, including oxygen scavengers, can be used; and EP 450254 relates to mixed free-radical and ionic photoinitiators with polymeric and monomeric (meth)acrylates and uses lasers with wavelengths greater than 400 nm. The commercially available materials from these classes can be obtained from Ciba, all of which have an $E_c>4$ in the range of 300–400 nm.

OBJECTS OF THE INVENTION

It is an object of the present invention to provide a novel photosensitive resin useful for stereolithography.

It is a further object of the present invention to provide a photosensitive resin having an improved photospeed.

It is yet another object of the present invention to provide a photopackage for a photosensitive resin that, upon formulation with an ethylenically unsaturated oligomer based on a (meth)acrylate-containing polyurethane, polyester, or (meth)acrylated epoxy, and also reactive diluents results in a photosensitive resin having a critical exposure energy $E_c$ of less than 1.5 mJ/cm$^2$.

Other objects and advantages of the present invention will become apparent through the disclosure herein.

DETAILED DESCRIPTION OF THE INVENTION

The present invention relates to a photopolymer composition which is especially well adapted for use in stereolithography, especially due to its improved photospeed coupled with acceptable size stability upon cure. The combination has the advantage of having an $E_c$ of less that 1.5 mJ/cm$^2$.

The Photopackage

The photopackage, or photoinitiator system, includes an air-curable initiator or blend of initiators plus a phosphorous compound, all of which are active in the range of about 250–400 nm.

The photoinitiator can in concept be any initiator having a strong absorbance at 250–400 nm. These include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2- dimethoxy-2-phenylacetophenone, i.e. Irgacure ®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acetophenone, o-methoxybenzophenone, acenaphthene-quinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybezoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. Most preferred is 2,2-dimethoxy-2-phenyl acetophenone. The photoinitiator is present in an amount of about 0.1 to 8 wt. %, preferably about 1 to 4 wt. %.

It is preferred to add a surface cure agent which is active in the range of 250–400 nm and not substantially inhibited by oxygen. Useable surface cure agents include the substituted and unsubstituted benzophenones, and benzophenone is preferred. This material is present in amounts of about 0.1 to 5 wt. %, preferably 0.5 to 3%.

The phosphorous compound is sensitive to UV light. It has been found that the organic derivatives of phosphines are useful in this invention. They have the general formula $PR_1R_2R_3$ wherein $R_1$, $R_2$ and $R_3$ can be identical or different and represent aliphatic, cycloaliphatic, aromatic, araliphatic or heterocyclic radicals, but one of the radicals $R_1$, $R_2$ or $R_3$ must always be an aromatic radical, and the percentages by weight mentioned relate to the total weight of unsaturated resin and copolymerizable monomers.

The following are representative phosphines useful in this invention: triphenylphosphine, tri-p-tolyl-phosphine diphenylmethyl-phosphine, diphenyl-ethyl-phosphinediphenylpropyl-prosphine, dimethyl-phenyl-phosphine, diethyl-phenyl-phosphine, dipropyl-phenyl-phosphine, divinyl-phenyl-phosphine, divinyl-p-methoxyphenyl-phosphine, divinyl-p-bromophenyl-phosphine, divinyl-p-tolyl-phosphine, diallyl-phenyl-phosphine, diallyl-p-methoxyphenyl-phosphine, diallyl-p-bromophenyl-phosphine, diallyl-p-tolyl-phosphine. Triphenyl phosphine is particularly preferred. This material is present in an amount of about 0.1 to 5 weight percent, preferably 0.2 to 3 wt. %.

Stabilizers may also be present, preferably in the range of about 0 to 3%. Preferred are 2,6-di-tert-butyl-4-methylphenol (preferably 0.1 to 1%) and 4-methoxy phenol (preferably 0.1 to 1%).

The photopackage described above can be combined with a photopolymer composition, preferably (meth)acrylate containing oligomers of molecular weight (by GPC) of about 300–5,000, preferably 500–2,000, and various reactive diluents.

The Photopolymer Composition

The photopolymer composition in concept can be any liquid ethylenically unsaturated monomer, oligomer, blend of oligomers or prepolymer based on polyurethane, polyester or (meth)acrylated epoxy and is typically formulated with reactive diluents.

The liquid ethylenically unsaturated monomer, oligomer or prepolymer, i.e., the (meth)acrylate terminated polyene is of the formula:

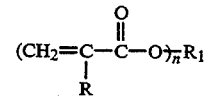

wherein R is H or $CH_3$, $R_1$ is an organic moiety and n is at least 2 of the composition herein, can be made by various reactants and methods.

One of these acrylate terminated materials is a polyether polyol urethane polyacrylate formed by reacting a polyether polyol with a polyisocyanate and a hydroxylalkyl acrylate. Another material may be a polyester polyol urethane polyacrylate formed by reacting a polyester polyol with a polyisocyanate and a hydroxyalkyl acrylate. Various commercially available polyurethane (meth)acrylates are the Photomer 6000 series, available from Henkel Corporation, Ambler, Pa., the CN 900 series from Sartomer Corp., West Chester, Pa. and the Ebecryl series by Radcure Specialities, Inc., Louisville, Ky. Still another material in this category is a (meth)acrylated epoxy formed by reacting a diepoxide with acrylic acid. A typical example is the reaction of Bisphenol-A epoxide with acrylic acid, represented by the Photomer 3000 series from Henkel. Yet another acrylate terminated material operable herein is a polyether or a polyester acrylate formed by end-capping a polyether polyol or polyester polyol with acrylic acid or acryoyl chloride. A commercially available example is the Photomer 5000 series from Henkel. Yet another acrylate terminated material operable herein is a urethane polyacrylate formed by end-capping a diisocyanate with a hydroxyalkyl acrylate.

A polyurethane methacrylate which is the reaction product of a polyether polyol, toluene diisocyanate and hydroxy propyl methacrylate, and which has a molecular weight measured by GPC of about 1,200, is preferred.

Polyurethane (meth)acrylate

These are oligomers prepared by reacting polyether or polyester diols with diisocyanate and further with a hydroxyalkyl (meth)acrylate.

The capped prepolymer is the radiation-curable polyurethane type which has received the most attention in research and development and achieved by far the most commercial use.

Polyether polyols such as poly(propylene oxide) diols, copoly(ethene oxide-propylene oxide) diols, poly(tetramethylene oxide) diols, and the wide range of polyester diols have all been used in practice. The hydroxyl groups of these polyols have been converted to urethane groups by reaction with one of the isocyanate groups of the diisocyanate. All of the commercially available diisocyanates have been utilized for oligomers and achieved some commercial use, i.e. methylene bis(-phenyl isocyanate) (MDI), (TDI): a commercial 80:20 mixture of 2,4- and 2,6-toluene diisocyanate, 3-isocyanatomethyl-3,5,5 trimethyl cyclohexylisocyanate (IPDI), methylene bis(cyclohexyl isocyanate) (Desmodur W), and probably others. More highly functional polyisocyanates could probably be used in polyurethane oligomers, but none are known to have been successful commercially.

Various (meth)acrylates such as 2-hydroxyethyl acrylate, 2-hydroxypropyl acrylate and 2-hydroxyethyl methacrylate are all commercially available and have been used effectively to introduce the acrylic unsaturation onto the ends of the oligomer chains. Hydroxyethyl acrylate is preferred because of the high reactivity of the hydroxyl group with isocyanate in the oligomer synthesis and the high reactivity of the acrylate double bond in the radiation-curing process. It is however the most toxic of the three. Pentaerythritol triacrylate (PETA), which contains approximately one equivalent of hydroxyl and three acrylate groups per mole, has occasionally been used as a hydroxy functional acrylate to introduce terminal acrylic functionality in a polyurethane. It naturally makes oligomers much more highly functional in acrylate groups than the others listed.

Conventional urethane—forming catalysts may be used in the reactions with diisocyanates. These catalysts include, e.g., organo-tin compounds such as dibutyl tin dilaurate and stannous octoate, organo-mercury compounds, tertiary amines, and mixtures of these materials.

Hydroxyalkyl (meth)acrylate

This material has the structure $HO-R^8OC(:O)-C(R^9)=CH_2$, where the R's are as above defined. Within this structure hydroxyethylmethacrylate is preferred.

Diluents

Possible diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethyloxylated bisphenol-A diacrylate, trimethylolpropane diacrylate, di-trimethylolpropane tetraacrylate, triacrylate of tris(hydroxyethyl) isocyanurate, dipentaerythritol hydroxypentaacrylate, pentaerythritol triacrylate, ethoxylated trimethlyolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate and the like and mixtures thereof which can be added to the photopolymerizable composition to modify the cured product. Mono(methyl)acrylates such as cyclohexyl methacrylate, isobornyl methacrylate, lauryl methacrylate and tetrahydrofurfuryl methacrylate are also operable, either singly or as blends, as reactive diluents. A preferred reactive diluent is ethoxylated trimethylol propane triacrylate.

One of ordinary skill in the art will readily recognize that various substitutions can be made for the named materials. The Examples below are provided for the purpose of illustrating the practice of the invention, and do not limit its scope or the scope of the claims which follow.

EXAMPLE 1

225 parts of a polyurethane methacrylate, which is a reaction product of a polyether polyol, toluene diisocyanate and hydroxypropyl methacrylate and has a Mw of 1,200, were mixed with 275 parts of premixed photoinitiators and stabilizers (25 parts) in 250 parts of ethoxylated trimethylol propane triacrylate. The premix comprised 11 parts of 2,2-dimethoxy-2-phenyl acetophenone, 4 parts of benzophenone, 2 parts of triphenyl phosphine (pre-dissolved in 2 parts of diethylether with subsequent evaporation of the diethylether during mixing in a vented hood), 1.5 parts of 2,6-di-tert-butyl-4-methyl phenol and 0.5 parts of 4-methoxy phenol. The mixed components were allowed to deaerate before testing in the SLA-190 machine (3D Systems, Valencia, Calif.). The photospeed properties (Table 1) were obtained using standard test parts (WINDOW PANE®). The flexural modulus was measured by a three-point bending test on the Instron 1011 with standard rectangular pieces of 150 mm×10 mm×2.5 mm.

EXAMPLE 2

225 parts of Photomer 3016, a bisphenol A epoxy diacrylate from Henkel Corporation, Ambler, Pa., were mixed with 267 parts of premixed photoinitiators and stabilizers (17 parts) in 250 parts of ethoxylated trimethylol propane triacrylate. The premix comprised 11 parts of 2,2-dimethoxy-2-phenyl acetophenone, 4 parts of benzophenone and 2 parts of triphenyl phosphine (pre-dissolved in 2 parts of diethylether with subsequent evaporation of the diethylether during mixing in a vented hood). The mixed components were allowed to dearate before testing in the SLA-190 machine (3D Systems, Valencia, Calif.). The photospeed properties (Table 1) were obtained using standard test parts (WINDOW PANE®).

Comparative Examples

The properties of three commercially available resins, Somos 2100 (Comparative Example 1) from E. I. dupont de Nemours and Cibatool XB5139 (Comparative Example 2) from Ciba Corporation and Loctite 8100 (Comparative Example 3) from Loctite Corporation, were obtained on the same SLA-190 as Examples 1–2.

TABLE 1

|  | Example 1 | Example 2 | Comparative Example 1 | 2 | 3 |
|---|---|---|---|---|---|
| $E_c$: Minimum cure energy, mJ/cm$^2$ | 0.8 | 1.4 | 4.6 | 3.2 | 7.5 |
| $D_p$: Depth of Cure, mils | 5.8 | 5.6 | 6.3 | 5.8 | 5.7 |
| Green Flexural Modulus, N/nm$^2$ | 363 | — | 484 | 388 | — |

Photospeed and depth of cure of other commercially available resins reported from the literature are listed below.

TABLE 1A

| PHOTOSPEED OF COMMERCIAL STEREOLITHOGRAPHY RESINS | | |
|---|---|---|
| Resin | $D_p$ (mils) | $E_c$ (mJ/cm$^2$) |
| Cibatool XB 5143 (Ciba) | 5.7 | 5.2 |
| Cibatool XB 5149 (Ciba) | 5.7 | 5.2 |
| Cibatool XB 5154 (Ciba) | 5.6 | 4.4 |

TABLE 1A-continued

| PHOTOSPEED OF COMMERCIAL STEREOLITHOGRAPHY RESINS | | |
|---|---|---|
| Resin | $D_p$ (mils) | $E_c$ (mJ/cm$^2$) |
| Cibatool XB 5170 (Ciba) | 4.8 | 13.5 |
| Somos 4110 (DuPont) | 4.5 | 2.5 |
| Somos 5110 (DuPont) | 4.0 | 2.5 |
| Somos 2110 (DuPont) | 4.7 | 3.5 |
| Somos 3110 (DuPont) | 5.0 | 2.5 |
| Exactomer 2201 (Allied Signal) | 7.0 | 27.0 |

EXAMPLE 3

225 parts of Photomer 5018 (a polyester acrylate from Henkel Corporation, Ambler, PA) were mixed with 250 parts of ethoxylated trimethylolpropane triacrylate and 35 parts of a premixture. The premixture comprised 11 parts of 2,2-dimethoxy-2-phenyl acetophenone, 4 parts of benzophenone and 8 parts of triphenylphosphine pre-dissolved in 12 parts of tetrahydrofurfuryl acrylate. The mixed components were allowed to deaerate before testing in the SLA-190 stereolithography machine (3D Systems, Valencia, Calif.). The photospeed properties were obtained (see following table) using standard test parts (WINDOWPANE®).

EXAMPLE 4

225 parts of the polyurethane methacrylate of Example 1 were mixed with 250 parts of ethoxylated trimethylolpropane triacrylate and 35 parts of a premixture. The premixture comprised 11 parts of 2,2-dimethoxy-2-phenyl acetophenone, 4 parts of benzophenone, 1.5 parts of 2,6-di-tert-butyl-4-methyl phenol, 0.5 parts of 4-methoxy phenol and 8 parts of triphenylphosphine pre-dissolved in 10 parts of a diethyleneglycol dimethacrylate. The mixed components were allowed to deaerate before testing in the SLA-190 stereolithography machine (3D Systems, Valencia, Calif.). The photospeed properties were obtained (see following table) using standard test parts (WINDOW PANE®).

TABLE 2

| Property | Example 3 | Example 4 |
|---|---|---|
| $E_c$: Mininum cure energy, mJ/cm$^2$ | 2.4 | 0.3 |
| $D_p$: Depth of Cure, mils | 6.6 | 5.1 |

Examples 1 and 4 used polyurethane methacrylate oligomers having a molecular weight of about 1200 with the inventors' photopackage. It can be seen that the resulting photosensitive resins have an $E_c$ of 0.8 and 0.3 mJ/cm$^2$ respectively, which represents a sharp improvement over Comparative Examples 1-3, all of which are commercially available photosensitive resins. Example 2 shows a bisphenol epoxy diacrylate and Example 3 shows a polyester acrylate, both treated in the manner of the present invention. Again, the examples show that the use of the instant photopackage greatly enhances the photospeed of these compositions. The most preferred compositions comprise this photopackage with the polyurethane methacrylate oligomers and this combination gives photospeeds far superior to presently commercial compositions (e.g. Tables 1 and 1A).

What is claimed is:

1. A method of manufacturing a three dimensional object from successive layers of a photocurable composition comprising the steps of:
    (a) forming a layer of a photocurable polymer composition;
    (b) exposing the layer to actinic radiation, thereby photocuring at least a portion of the layer;
    (c) introducing a new layer of photocurable polymer composition into the exposed layer in (b);
    (d) exposing the new layer in (c) to actinic radiation, thereby photocuring at least a portion of the layer in (c)

wherein the photocurable polymer composition is UV curable in air and comprises

A. a photoinitiator system which is
    (1) at least one trivalent phosphorous compound;
    (2) at least one photoinitiator; and
    (3) a surface cure agent, and
B. a photopolymer which is an ethylenically unsaturated oligomer based on polyurethane, polyester or epoxy, wherein the photosensitive composition has a critical exposure energy $E_c$ of less than about 1.5 mJ/cm$^2$ and
C. reactive diluents.

2. The method of claim 1, wherein (1) is an organic derivative of a phosphine.

3. The method of claim 1, wherein (1) is triphenyl phosphine.

4. The method of claim 1, wherein (2) is 2,2-dimethoxy-2-phenyl acetophenone.

5. The method of claim 1, wherein (3) is a substituted or unsubstituted benzophenone.

6. The method of claim 1, wherein oligomer B is a polyurethane (meth)acrylate.

7. The method of claim 1, wherein oligomer B is a reaction product of a polyether polyol, toluene diisocyanate and hydroxypropyl methacrylate.

8. The method of claim 1 wherein one of the reactive diluents C is ethoxylated trimethylol propane triacrylate.

9. The method of claim 1 wherein the photocurable polymer comprises, in weight percent:
    (1) triphenylphosphine (0.1 to 5%);
    (2) 2,2-dimethoxy-2-phenyl acetophenone (0.1 to 8%);
    (3) benzophenone (0.1 to 5%).

10. The method of claim 1 wherein the photocurable polymer further comprises (4) stabilizers (0.1 to 3%).

11. The method of claim 10 wherein the stabilizers (4) are 2,6-di-tert-butyl-4-methyl phenol and 4-methoxy phenol.

12. The method of claim 11 wherein, in weight percent:
    (1) is triphenylphosphine (0.2 to 3%);
    (2) is 2,2-dimethoxy-2-phenyl acetophenone (1 to 4%);
    (3) benzophenone (0.5 to 3%);
    (4) is 2,6-di-tert-butyl-4-methyl phenol (0.1 to 1%) and 4-methoxyphenol (0.1 to 1%).

* * * * *